(12) United States Patent
Cartier et al.

(10) Patent No.: US 11,511,990 B2
(45) Date of Patent: Nov. 29, 2022

(54) METHOD FOR MANUFACTURING A MICROELECTRONIC DEVICE COMPRISING A MEMBRANE SUSPENDED ABOVE A CAVITY

(71) Applicant: COMMISSARIAT A L'ENERGIE ATOMIQUE ET AUX ENERGIES ALTERNATIVES, Paris (FR)

(72) Inventors: Mathilde Cartier, Grenoble (FR); Bruno Fain, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 7 days.

(21) Appl. No.: 17/304,329

(22) Filed: Jun. 18, 2021

(65) Prior Publication Data
US 2021/0395079 A1    Dec. 23, 2021

(30) Foreign Application Priority Data
Jun. 18, 2020    (FR) .................................. 20 06397

(51) Int. Cl.
  *B81C 1/00*    (2006.01)
(52) U.S. Cl.
  CPC .. *B81C 1/00158* (2013.01); *B81C 2201/0133* (2013.01); *B81C 2203/038* (2013.01)
(58) Field of Classification Search
  CPC .................. B81C 1/00158; B81C 1/00182
  See application file for complete search history.

(56) References Cited

U.S. PATENT DOCUMENTS

2017/0210617 A1*  7/2017  Sadaka ................... B81B 1/002
2020/0269279 A1*  8/2020  Miao ................... B81C 1/00158
(Continued)

FOREIGN PATENT DOCUMENTS

WO    WO 2014/206737 A1    12/2014
WO    WO 2020/128244 A1    6/2020
WO    WO 2020/128245 A1    6/2020

OTHER PUBLICATIONS

French Preliminary Search Report dated Feb. 26, 2021 in French Application 20 06397 filed on Jun. 18, 2020, 10 pages (with English Translation of Categories of Cited Documents & Written Opinion).
(Continued)

*Primary Examiner* — Moazzam Hossain
(74) *Attorney, Agent, or Firm* — Oblon, McClelland, Maier & Neustadt, L.L.P.

(57) ABSTRACT

A method for manufacturing a microelectronic device with a membrane suspended above at least one final cavity, may involve providing a supporting substrate having at least one elementary cavity, and a donor substrate. The method may include assembling the supporting and donor substrate, then thinning the donor substrate so as to form the membrane. Advantageously, the method may include forming at least one membrane anchoring pillar. After the forming of the at least one anchoring pillar, and after the assembling, the method may include etching the surface layer of the supporting substrate so as to widen the at least one elementary cavity, to form the final cavity, the etching being configured to selectively etch the surface layer with respect to the anchoring pillar.

18 Claims, 12 Drawing Sheets

(56) References Cited

U.S. PATENT DOCUMENTS

2020/0331750 A1 10/2020 Sadaka et al.
2020/0391994 A1* 12/2020 Robert .................... B81B 7/02

OTHER PUBLICATIONS

Yun et al., "Fabrication of Silicon and Oxide Membranes Over Cavities Using Ion-Cut Layer Transfer", Journal of Microelectromechanical Systems, vol. 9, No. 4, Dec. 2000, 4 pages.

* cited by examiner

A-A

METHOD FOR MANUFACTURING A MICROELECTRONIC DEVICE COMPRISING A MEMBRANE SUSPENDED ABOVE A CAVITY

CROSS-REFERENCE TO RELATED APPLICATIONS

The present application claims the benefit of the filing date of French Appl. No. 2006397, filed on Jun. 18, 2020, the content of which is incorporated by reference.

TECHNICAL FIELD

The present invention relates to the field of micro-electronic devices comprising a membrane suspended above a cavity. It has a particularly advantageous application in the field of transducers known as Micromachined Ultrasonic Transducers, MUTs.

PRIOR ART

The development of MEMS and NEMS generalised the opportunities of microelectronics to many applications, in particular for applications based on membrane devices.

These devices are for example acoustic transducers. Transducers can use various techniques for activating the membrane or for measuring the activity of the membrane. One of them uses piezoelectricity. Such a transducer, known under the name "Piezoelectric Micromachined Ultrasonic Transducer" or under its acronym pMUT, generates and/or detects an ultrasonic wave by means of a membrane set into motion by a piezoelectric actuator deposited in a thin layer on the latter for generating the wave and by generating electrical charges in the piezoelectric layer during the detection.

Other transducers follow a capacitive control. Such a transducer, known under the name "Capacitive Micromachined Ultrasonic Transducer" or under its acronym cMUT, generates and/or detects an ultrasonic wave by means of a membrane set into motion by the capacitive effect between the membrane and the bottom of the cavity of the cMUT.

These MEMS devices include one or a plurality of membranes, forming the vibration mechanical portion of the device. It is typically suspended above a cavity. It thus produces a structure that is essentially deformable in flexion. During the operation of the device in reception, the flexion of the membrane can be converted into an electrical signal, and inversely for operation in emission.

The proper operation of these devices depends in particular on the state of the membrane. The manufacturing of these membranes is per se a technical difficulty with regards to the scale of the dimension concerned, with the reminder that the thickness of the membrane is often much less than 10 μm ($10^{-6}$ m) and generally less than 1 μm. A difficulty is to preserve the mechanical reliability of the suspension of the membrane during the steps of manufacturing the device. Furthermore, according to the type of device, the geometry of the cavity can vary.

There are methods for manufacturing a microelectronic device comprising a membrane suspended above a cavity wherein a supporting substrate comprising cavities opening onto the surface of this substrate, and a donor substrate, are provided. The supporting substrate and the donor substrate are then assembled by attaching the surface of the supporting substrate to the surface of the donor substrate. Then, the donor substrate is thinned in such a way as to form the membrane, which is then suspended above the cavities formed in the supporting substrate. In practice, these methods are limited as to the geometries of the cavities that can be obtained. In particular, it remains difficult to obtain a membrane of low thickness suspended on cavities of large dimensions.

An object of the present invention is therefore to propose a method for manufacturing a device comprising a membrane suspended above a cavity of a substrate, that makes it possible to overcome the aforementioned disadvantages. In particular, an objective of the invention can be to propose a method for manufacturing a device comprising a membrane suspended above a cavity of a substrate, making it possible to modulate the dimensions of the cavity while still preserving the integrity of the membrane.

The other objects, features and advantages of the present invention shall appear when examining the following description and the accompanying drawings. It is understood that other advantages can be incorporated.

SUMMARY

To achieve this objective, according to an embodiment a method for manufacturing a microelectronic device is provided comprising a membrane suspended above at least one final cavity, the method comprising:
  providing a supporting substrate comprising a surface layer having a first face,
  forming at least one elementary cavity in the surface layer of the supporting substrate, the at least one elementary cavity opening at said first face, and
  providing a donor substrate having a first face, then
  forming at least one membrane suspended above at least one final cavity, the forming of the membrane comprising:
    assembling the supporting substrate and the donor substrate by attaching the first face of the supporting substrate to the first face of the donor substrate, in such a way that the donor substrate covers at least partially the at least one elementary cavity, then
    thinning the donor substrate in such a way as to form the membrane.

Advantageously, before or after the forming of the membrane, the method further comprises forming at least one anchoring pillar of the membrane, the at least one anchoring pillar being:
  made of or based on at least one material different from a material forming the surface layer, and
  configured to support at least one lower face of the membrane, at least at an edge of the membrane.

After the forming of the at least one anchoring pillar, and after the assembling, the method comprises advantageously an etching of the surface layer of the supporting substrate in such a way as to widen the at least one elementary cavity, in at least one direction parallel to a main plane of extent of the first face of the surface layer of the supporting substrate, to form the final cavity.

Said etching is configured in such a way as to selectively etch the surface layer with respect to the at least one material of the at least one anchoring pillar.

Thus, the etching of the surface layer of the supporting substrate makes it possible to enlarge the at least one elementary cavity after the membrane has been transferred from the donor substrate on the supporting substrate. The risk of the membrane being damaged during the method is limited, even avoided. Consequently, it is possible to obtain a membrane suspended above at least one final cavity that is further extended than thanks to the existing solutions.

By forming an anchoring pillar that is more resistant to the etching than the surface layer, the etching can propagate in the surface layer of the supporting substrate until reaching the anchoring pillar, which will be conserved. According to the embodiments considered, the anchoring pillar can thus form a physical limit to the etching of the surface layer of the supporting substrate.

In practice, the etching of the surface layer of the supporting substrate can be difficult to control to obtain final cavities with a defined and reproducible shape. Using an anchoring pillar as a physical limit to the etching makes it possible to obtain final cavities that are better defined, and this, with better reproducibility.

Furthermore, using an anchoring pillar as a physical limit to the etching makes it possible, according to the disposition of the anchoring pillar or pillars, to customise the dimensions and/or the shape of a final cavity or the final cavities. In particular, the final cavity or cavities obtained do not necessarily depend on the geometry of the elementary cavities.

BRIEF DESCRIPTION OF THE FIGURES

The purposes, objects, as well as the features and advantages of the invention shall appear better in the detailed description of an embodiment of the latter which is shown in the following accompanying drawings wherein.

Figure 1:
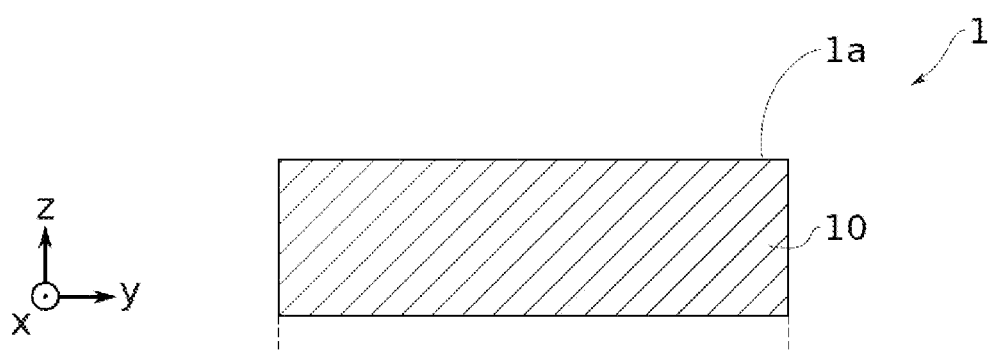
FIG. 1 shows a transversal cross-section view of the upper portion of a supporting substrate implemented in the method, according to an embodiment.

The drawings are given by way of examples and do not limit the invention. They form schematic block representations intended for facilitating the understanding of the invention and are not necessarily to the scale of the practical applications. In particular the thicknesses and the relative dimensions of substrate, layer, or portions, shown do not represent reality.

DETAILED DESCRIPTION

Before beginning a detailed review of the embodiments of the invention, optional features are mentioned hereinafter that can possibly be used combined or alternatively:
- the material of the at least one anchoring pillar has a resistance to an etching of the surface layer of the supporting substrate, greater than a resistance of the surface layer to said etching,
- the material of the membrane also has a resistance to an etching of the surface layer of the supporting substrate, greater than a resistance of the surface layer to said etching,
- the etching of the surface layer of the supporting substrate is carried out after the thinning,
- the widening of the at least one elementary cavity comprises the merging of the at least one elementary cavity with at least one neighbouring, even adjacent, elementary cavity,
- the forming of the at least one anchoring pillar is carried out before assembling the supporting substrate and the donor substrate,
- the forming of the at least one anchoring pillar is carried out after the assembly of the supporting substrate and of the donor substrate,
- the forming of the at least one anchoring pillar is configured in such a way that the at least one anchoring pillar is continuous, and extends along at least one edge of the membrane. According to an example, the anchoring pillar is continuous and extends along at least one edge of the membrane by forming a closed periphery,
- the forming of the at least one anchoring pillar is configured in such a way that the at least one anchoring pillar is punctual, a plurality of anchoring pillars being distributed along at least one edge of the membrane. According to an example, the anchoring pillar is punctual, a plurality of anchoring pillars being regularly distributed along at least one edge of the membrane,
- the forming of the at least one anchoring pillar is configured in such a way that the at least one anchoring pillar is configured to surround at least the lower face and an upper face of the membrane, the at least one elementary cavity is defined by lateral walls and a bottom, the forming of the at least one anchoring pillar is carried out after the assembly of the supporting substrate and of the donor substrate and comprises:

etching at least one portion of the assembly formed by the donor substrate and the supporting substrate, from one among a second face of the donor substrate or an upper face of the membrane, to a depth of the supporting substrate equal to a depth of the bottom of the at least one elementary cavity, a deposition of the at least one material of the at least one anchoring pillar, the deposition of the at least one material of the at least one anchoring pillar, is an atomic layer deposition, abbreviated ALD, the etching of the surface layer of the supporting substrate comprises:

forming at least one opening through one among the donor substrate and the membrane, injecting through the at least one opening, an etching compound, the at least one opening is formed plumb with at least one elementary cavity, an opening is formed plumb with each elementary cavity, in projection in a plane parallel to the main plane of extent of the surface layer of the supporting substrate, the surface of an opening is contained in the surface of an elementary cavity, during the forming of the at least one elementary cavity in the surface layer of the supporting substrate, several elementary cavities are formed, the elementary cavities form an array, preferably periodic, in the main plane of extent of the first face of the surface layer of the supporting substrate, the method comprises, prior to the etching of the surface layer of the supporting substrate, a step of defining a group of elementary cavities, and the etching of the surface layer of the supporting substrate is configured to merge together the elementary cavities of said group, to form the final cavity, the elementary cavities each being defined by lateral walls and a bottom, the elementary cavities of the group are separated two by two by a common lateral wall. The final cavity can be formed by the etching of the common lateral walls of the group of elementary cavities, the thinning of the donor substrate comprises an oxidation of the donor substrate, to form an oxidised portion extending to a first portion of the donor substrate intended for forming the membrane, then an etching of the oxidised portion of the donor substrate, providing the donor substrate comprises an ion implantation in a buried portion of the donor substrate, the buried portion being disposed at the interface between a first portion of the donor substrate intended for forming the membrane and a second portion of the donor substrate intended for forming the rest of the donor substrate, and the thinning of the donor substrate comprises a fracture of the donor substrate at the buried portion, the thinning of the donor substrate comprises at least one mechanical rectification and/or at least one mechanical-chemical polishing and/or at least one chemical etching and/or at least one plasma etching, at its rear face, for example after the fracture, the assembling of the supporting substrate and of the donor substrate comprises the direct bonding of the first face of the donor substrate to the first face of the supporting substrate, the thinning of the donor substrate is configured in such a way as to obtain a membrane with a thickness between 0.05 µm and 20 µm, preferably between 0.1 and 2 µm, the at least one anchoring pillar is made of or based on at least one from monocrystalline silicon, polycrystalline silicon, silicon nitride, alumina, and a polymer, such as parylene, at least one from an upper portion of the supporting substrate and a surface layer of the donor substrate is made of or based on at least one from silicon, a silicon semiconductor alloy such as silicon carbide and a silicon-germanium alloy. More preferably, at least one from an upper portion of the supporting substrate and a surface layer of the donor substrate is made of or based on monocrystalline silicon.

According to an example, the upper portion underlying to the surface layer is made of silicon and the surface layer is made of silicon oxide.

It is specified that in the scope of the present invention, the term "on", "overmounts"», or the equivalents thereof do not necessarily mean "in contact with". Thus, for example, the deposition of a layer on another layer, does not necessarily mean that the two layers are directly in contact with one another but this means that one of the layers covers the other at least partially by being either directly in contact with it, or by being separated from it by a film, yet another layer or another element. A layer can moreover be comprised of several sublayers of the same material or of different materials.

In the following description, the layer, zone or portion thicknesses as well as the depths are generally measured according to a vertical direction, parallel to the stacking direction and perpendicular to the main plane of extent of the substrate, of the layer, of the sublayer or of the portion.

"A substrate, layer, zone or portion "based on" a material A means a substrate, layer, zone or portion that comprises this material A, for example by at least 50%, and possibly other materials, for example doping elements.

In what follows, a marking is used of which the longitudinal or front/rear direction corresponds to the X axis, the transversal or left/right direction corresponds to the Y axis, and the vertical or bottom/top direction corresponds to the axis z.

A parameter "substantially equal to/greater than/less than" a given value means that this parameter is equal to/greater than/less than the given value, by 10% more or less, even by 5% more or less, of this value.

"Direct bonding" means a bonding without the adding of adhesive material (of the glue or polymer type in particular) which consists in putting into contact relatively smooth surfaces (with a roughness typically less than 5 Å, 1 Å being equal to $10^{-10}$ m), for example carried out at ambient temperature and under ambient atmosphere, so as to create an adherence between them. According to an example, the direct bonding of two substrates means that the bonding is obtained by molecular adhesion, i.e. by the chemical bonds that are established between the two surfaces put into contact.

"Microelectronic device" means any type of device carried out with microelectronic means. These devices encompass in particular, in addition to devices with a purely electronic purpose, micromechanical or electromechanical devices (MEMS, for microelectromechanical systems), NEMS (nanoelectromechanical systems) as well as optical or optoelectronic devices (MOEMS, for Micro-Opto-Electro-Mechanical System).

The method for manufacturing a microelectronic device, comprising a membrane 20' suspended above at least one final cavity 110', is now described according to an embodiment and in reference to FIGS. 1 to 12B. Note that, in the scope of the present application, the term "membrane" does not imply any particular limiting feature. The term "membrane" equivalently designates a film or a layer, of any thickness. "Suspend" above at least one cavity means that the membrane overhangs the at least one cavity, by covering it at least partially, even completely. As shall be seen in detail hereinafter, the membrane can be suspended by at least one anchoring point, also called anchoring pillar.

As detailed in what follows, the method comprises several steps of etching. Each one of the etchings can be a dry etching, and more preferably a wet etching. Each one of the steps of etching can be preceded by the application of a mask, for example coming from a positive or negative lithography, and followed by the removal of this mask. This mask can be a resin, for example a photosensitive resin.

As shown in FIG. 1, the method comprises the providing of a supporting substrate 1. The supporting substrate 1 comprises an upper portion 10, for example made of or based on monocrystalline semiconductor material. By way of example, the semiconductor material can be chosen from silicon, or semiconductor silicon alloys such as silicon carbide of formula SiC and a silicon-germanium alloy of formula Si—Ge. In what follows, reference is made to the case where the semiconductor material is made of or based on silicon.

Note that in the figures, only the upper portion 10 of the supporting substrate 1 is shown. The supporting substrate 1 can nevertheless be in the form of a stack of a plurality of layers, for example made of or based on different materials. The upper portion 10 can furthermore be solely comprised of monocrystalline silicon, ignoring the impurities linked to the elaboration of the silicon. The supporting substrate 1 can for example be a wafer of silicon. According to an example, the supporting substrate 1 is a silicon wafer with a diameter of 200 mm ($10^{-3}$ m).

Figure 2:
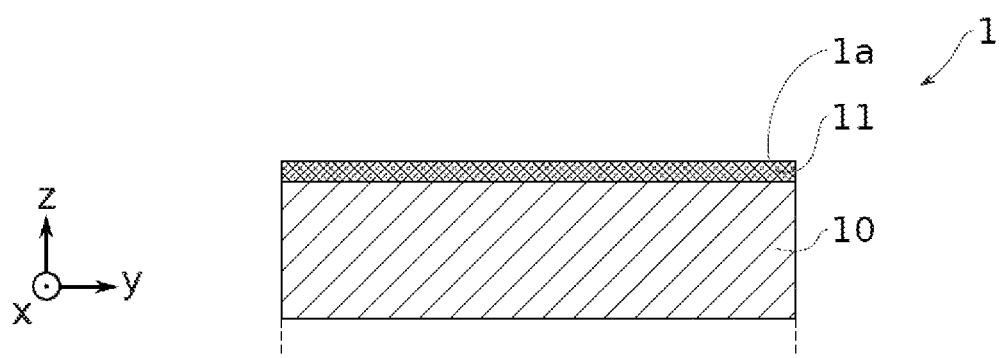
FIGS. 2 to 3B show, from the substrate shown in FIG. 1, the forming of at least one elementary cavity in the supporting substrate, according to transversal cross-section views and a top view.

As shown in FIG. 2, the supporting substrate 1 comprises a surface layer 11, located on the surface of the supporting substrate 1 and having a first surface 1a. The surface layer 11 can more particularly overmount the upper portion 10. The surface layer 11 is more particularly based on or made of a material different from the material forming the upper portion 10. More preferably, the surface layer 11 is based on or is made of an oxide. According to an example, the surface layer 11 is an oxide of the material of the upper portion 10.

The method then comprises the forming of at least one elementary cavity 110 in the surface layer 11 of the supporting substrate 1. In what follows, reference is made to the example according to which several elementary cavities are formed in the surface layer 11. The elementary cavities 110 open at the first face 1a of the supporting substrate 1. Comme shown when passing from FIG. 1 to FIG. 2, the forming of the elementary cavities 110 can include an oxidation of a portion of the upper portion 10 to form the surface layer 11 at least the first face 1a of the supporting substrate 1. This oxidation can be a thermal oxidation. The surface layer 11 can extend according to a plane parallel to the main plane of extent (x, y) of the upper portion 10. The thickness of the surface layer 11 can be of a few hundred nm ($10^{-9}$ m), for example this thickness is comprised between 100 nm and 3 µm.

Figure 3A:
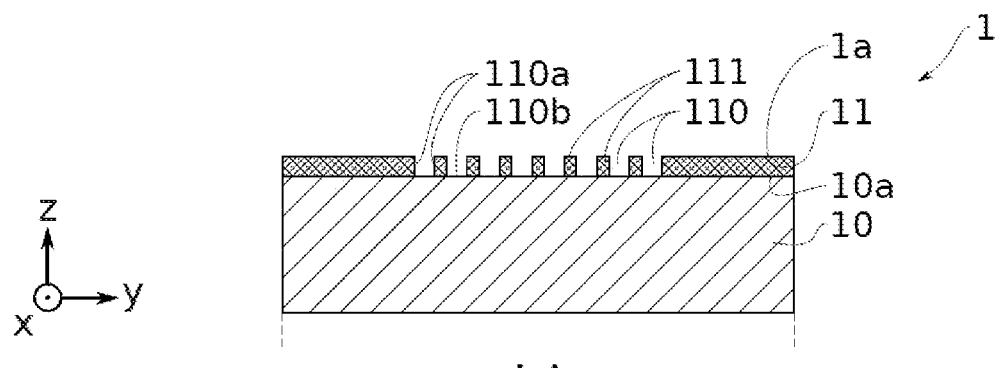

The elementary cavities 110 can be etched in the surface layer 11, as shown in FIG. 3A. The elementary cavities 110 can be delimited by lateral walls 110a and a bottom 110b parallel to the main plane of extent (x, y) of the surface layer 11, even confounded with a surface 10a at the interface between the surface layer 11 and the upper portion 10. The elementary cavities 110 can extend vertically over substantially the entire thickness of the surface layer 11.

The elementary cavities 110 can be of varied shapes and dimensions according to the target device 4, shown in FIGS. 11A to 12B described hereinafter. They can be for example square, rectangular, round or polygonal. Their lateral dimensions, in the plane (x, y), can be comprised between substantially 1 µm ($10^{-6}$ m) and several hundred µm, preferably between 1 µm and a few tens of µm. The depth of the elementary cavities 110 can be comprised between a few tens of nm and a few µm, preferably between a few tens of nm and a few hundred nm, according to the axis z shown in FIG. 3A. In particular, the depth of the elementary cavities 110 can be less than or more preferably equal to the thickness of the surface layer 11.

The elementary cavities 110 can be spaced from each other by portions 111 of the surface layer 11. These portions 111 can be lateral dimensions, in the plane (x, y), greater than the lateral dimensions of the elementary cavities 110, for example at least three times greater. These elementary cavities 110 can be shown for example in FIGS. 8C and 9D. According to an alternative example, the elementary cavities 110 can be spaced from each other by portions 111 of the surface layer 11, by lateral dimensions, of the same magnitude as the lateral dimensions of the elementary cavities. The portions 111 separating the elementary cavities are designated by the term "pillar". Each pillar 111 can have lateral dimensions, in the plane (x, y), between a few µm to a few hundred µm, even a few mm. It shall be seen in what follows that at least one portion of these pillars 111 can be qualified as "temporary".

Figure 3B:
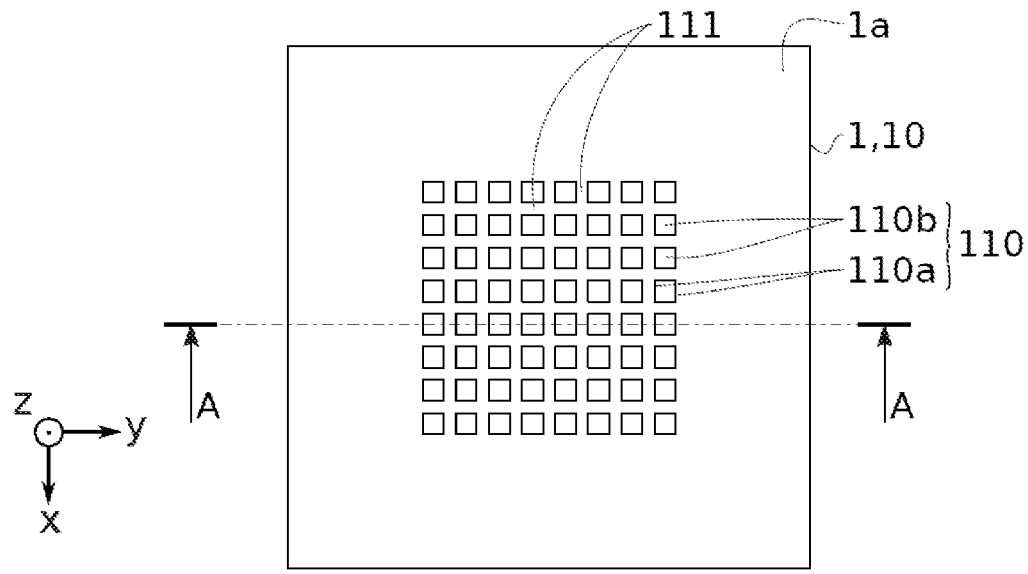

The elementary cavities 110 can form a periodic array in the main plane of extent (x, y) of the surface layer 11, as shown for example in FIG. 3B. The planar distribution of the elementary cavities 110, i.e. the distribution thereof in the plane (x, y) also depends on the target device and defines the dimension of the pillars 111. The elementary cavities 110 can be substantially identical to each other and distributed uniformly in the surface layer 11 of the supporting substrate 1. Note that the supporting substrate 1 can have elementary cavities 110 that have shapes, lateral dimensions, depths and/or a planar distribution that are different, according to the zones of the surface layer 11, in particular if it is planned to co-integrate devices 4 of different types on the supporting substrate 1.

The elementary cavities 110 can be formed beforehand by a provider of the supporting substrate 1. Typically, the supporting substrate 1 provided then has elementary cavities with lateral dimensions of a few tens of µm, for example between 10 µm and 20 µm. In the case of a generic substrate, the elementary cavities 110 re typically substantially identical to each other and distributed uniformly in the surface layer 11. As shall be seen in what follows, the method indeed makes it possible, from elementary cavities 110, for example coming from a substrate available at a supplier, to obtain a final cavity or final cavities 110' with customised dimensions and/or shape.

Figure 4:
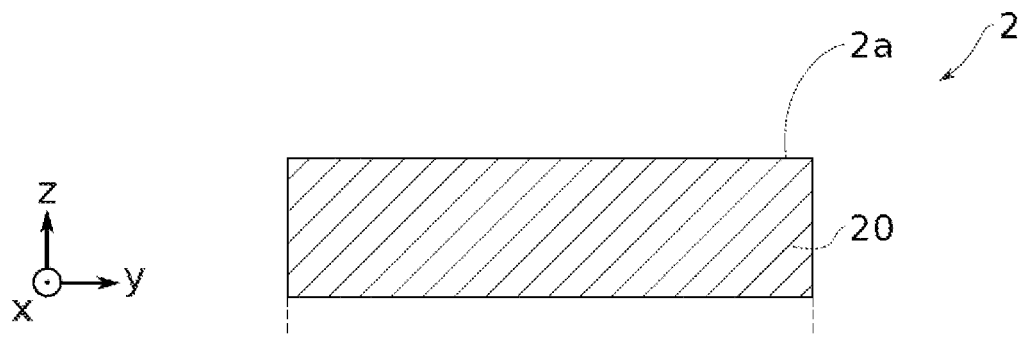
FIG. 4 shows a transversal cross-section view of the surface layer of a donor substrate implemented in the method according to an embodiment.

As shown in FIG. 4, the method comprises the providing of a donor substrate 2. The donor substrate 2 can include a surface layer 20, for example made of or based on monocrystalline semiconductor material. By way of example, the semiconductor material can be chosen from silicon, or semiconductor silicon alloys such as silicon carbide of formula SiC and a silicon-germanium alloy of formula Si—Ge. In what follows, reference is made to the case where the semiconductor material is made of or based on silicon. The surface layer 20 can furthermore be comprised solely of monocrystalline silicon, ignoring the impurities linked to the elaboration of the silicon.

Note that in the figures, only the surface layer 20 of the donor substrate 2 is shown. As for the supporting substrate 1, the donor substrate 2 can nevertheless be in the form of a stack of a plurality of layers, for example made of or based on different materials. The surface layer 20, is located on the surface of the donor substrate 2 and has a first surface 2a.

The donor substrate 2 can for example be a substrate of the semiconductor-on-insulator type, and more particularly of the silicon-on-insulator type (commonly abbreviated as SOI), comprising a buried oxide layer (commonly designated by the acronym BOX). According to an example, the donor substrate 2 is an SOI substrate of diameter 200 mm. The BOX layer can typically have a thickness of a few hundred nm and the surface layer 20 of silicon can typically have a thickness comprised between a few hundred nm to several μm. If it is sought to obtain a thickness particularly of the surface layer 20, providing the donor substrate 2 can include an oxidation of a portion of the surface layer 20 from the surface 2a, to form an oxidised portion (not shown in the figures) followed by an etching of this oxidised portion. Note than it can be provided that the surface layer 20 be covered with a thin layer of oxide. According to an example, the donor substrate 2 is a silicon wafer, for example of diameter 200 mm.

Figure 5:
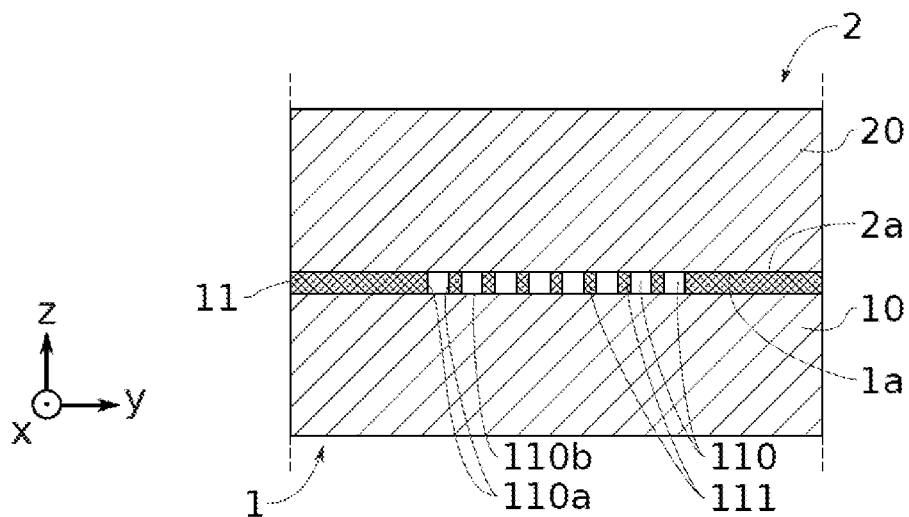
FIG. 5 shows assembling the supporting substrate shown in FIG. 3A and the donor substrate shown in FIG. 4, according to a transversal cross-section view.

The method then comprises assembling the supporting substrate 1 and the donor substrate 2. During this assembling, the first face 1a of the supporting substrate 1 is joined to the first face 2a of the donor substrate 2. The first face 1a of the supporting substrate 1 and the first face 2a of the donor substrate 2 can be directly in contact. As shown in FIG. 5, the donor substrate 2 covers at least partially, and more preferably entirely, the elementary cavities 110. According to an example, the supporting substrate 1 and the donor substrate 2 are assembled by direct bonding, and more particularly by molecular adhesion between their first faces 1a, 2a. The direct bonding can be obtained without requiring then application of substantial pressure on the substrates to be assembled. A slight pressure can simply be applied to initiate the bonding. A thermal annealing can furthermore be carried out to initiate the bonding.

To form the suspended membrane 20', the donor substrate 2 is thinned, after the assembling. The donor substrate 2 can more particularly be thinned in order to retain only the portion intended for forming the membrane 20', of a thickness comprised between 0.05 μm and 20 μm, preferably between 0.1 μm and 2 μm.

Figure 6A:
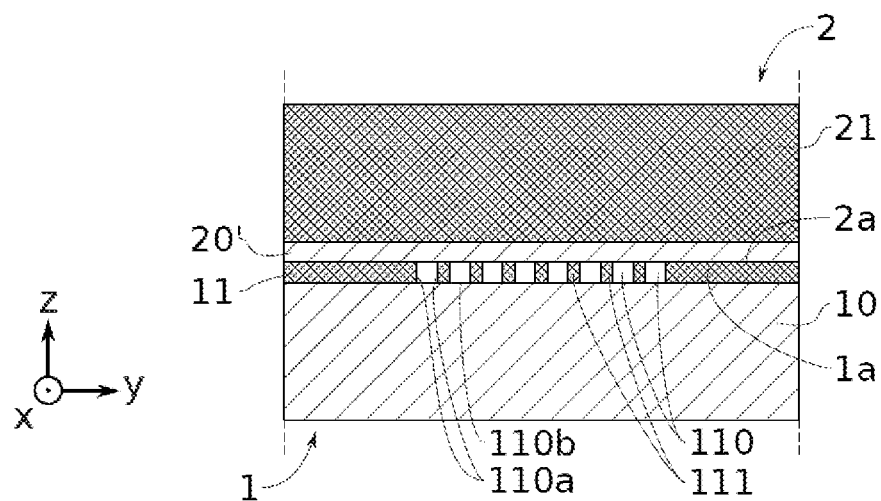
FIGS. 6A and 6B show, from the assembling shown in FIG. 5, the thinning of the donor substrate to form the membrane, according to a transversal cross-section view, for an embodiment of the method.
Figure 6B:
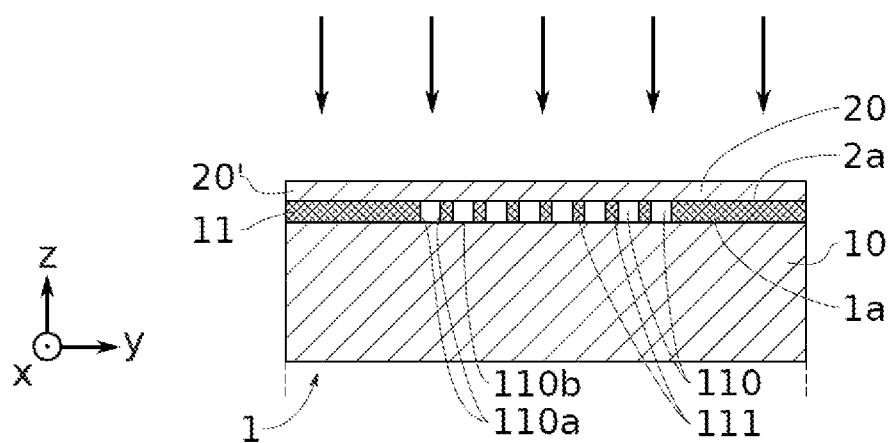

According to a first example, shown in FIGS. 6A and 6B, the thinning of the donor substrate 2 can include an oxidation of the donor substrate 2 to form an oxidised portion 21. The oxidised portion 21 can extend from a rear face of the donor substrate 2, i.e. the face opposite its first face 2a, to a first portion of the donor substrate 2 intended for forming the membrane 20'. The oxidised portion 21 can then be etched, for example in the direction of the arrows shown in FIG. 6B. As shown in FIG. 6B, it is possible to conserve only the first portion of the donor substrate 2 intended for forming the membrane 20'. Prior to the oxidation of the donor substrate 2, the donor substrate 2 can furthermore be thinned, for example by mechanical rectification of its rear face. This embodiment is particularly adapted to form a membrane 20' of a thickness comprised between 2 μm and 20 μm.

According to a more particular example, when the donor substrate 2 is a substrate of the semiconductor-on-insulator type, and more particularly silicon-on-insulator comprising a buried oxide layer, the donor substrate can be thinned, for example by mechanical rectification and/or by mechanical-chemical polishing and/or by chemical etching and/or by plasma etching, from its rear face to the buried oxide layer, and more particularly to the upper face of the buried oxide layer. The buried oxide layer can thus form a barrier to the etching. The buried oxide layer can then be removed, for example by wet etching with hydrofluoric acid. Thus, only the first portion of the donor substrate 2 extending initially between the surface 2a and the lower face of the buried oxide layer, and intended for forming the membrane 20', is retained. This embodiment is particularly adapted to form a membrane 20' with a thickness comprised between 0.1 μm and 2 μm.

Figure 7A:
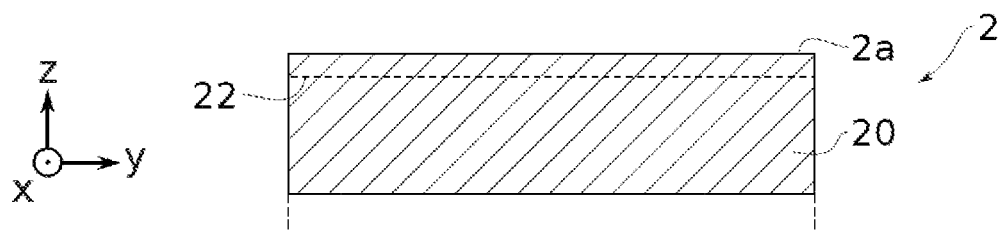
FIGS. 7A to 7D show, from an assembling shown in FIG. 5, the thinning of the donor substrate to form the membrane, according to a transversal cross-section view, for another embodiment of the method.
Figure 7B:
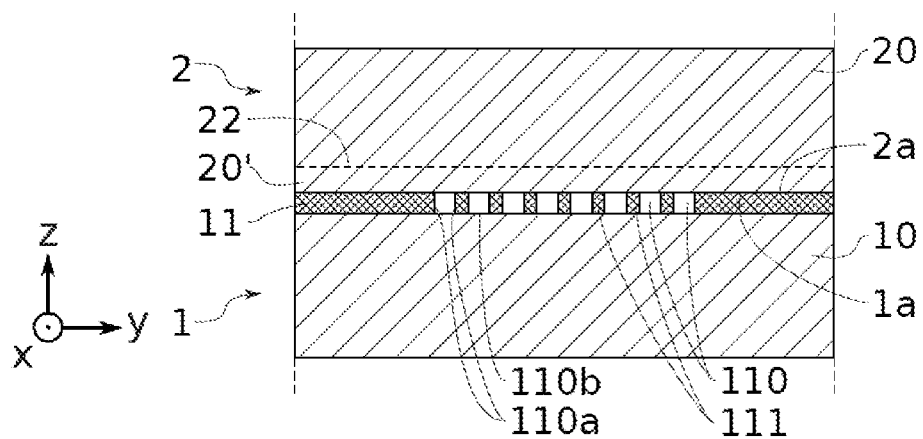

According to an alternative example, providing the donor substrate 2 can include an implantation of light species, for example of ions, in a buried portion 22 of the donor substrate 2. As shown in FIG. 7B, the buried portion 22 can be disposed at the interface between a first portion of the donor substrate 2 intended for forming the membrane 20' and a second portion of the donor substrate 2, intended for forming the rest of the donor substrate 2, also called sacrificial portion, and for being removed afterwards. The implantation can be an implantation of light ions, for example hydrogen ions, at an implantation depth comprised between a few hundred nm and a few μm, for example between 0.2 μm and 2 μm. This embodiment is particularly adapted to form a membrane 20' with a thickness comprised between 0.1 μm and 2 μm.

Figure 7C:
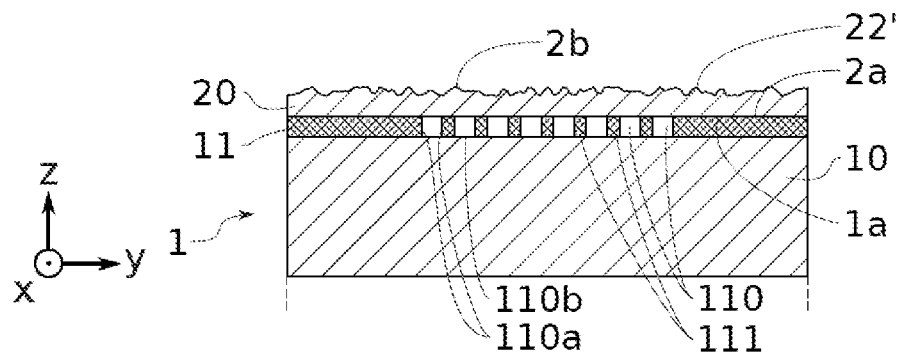

According to this example, the thinning of the donor substrate 2 can include a fracture, or in an equivalent manner a detaching, of the donor substrate on a fracture zone 22' at the buried portion 22. Following this fracture, the first portion of the donor substrate 2, intended for forming the membrane 20', can remain in contact with the supporting substrate 1, while the second portion of the donor substrate 2 can be removed, as shown in FIG. 7C. This fracture can for example be carried out mechanically and/or by a fracture annealing, carried out at a temperature of about a few hundred degrees Celsius, for example substantially 500° C.

Figure 7D:
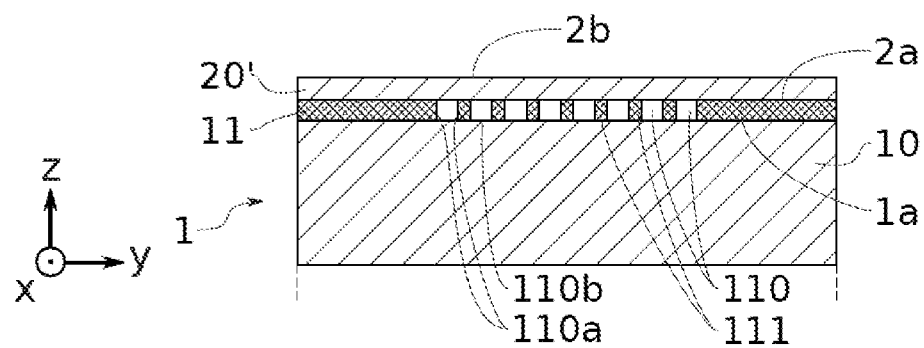

The thinning of the donor substrate 2, regardless of the embodiment implemented, can then include a chemical polishing, mechanical or chemical-mechanical of the rear face 2b of the donor substrate 2, as shown by way of example when passing from FIG. 7C to FIG. 7D. The membrane 20' obtained following the thinning of the donor substrate 2 can have a thickness comprised between a few hundred nm to a few μm, for example between 0.2 μm and 2 μm.

Regardless of the method used for the deposition of a membrane 20' on one or more elementary cavities 110, during the development of the invention it was revealed that it is difficult to keep the membrane 20' intact beyond a limit size of cavities. According to the first two examples described hereinabove, this limit size is substantially 200 μm. According to the second example, wherein the thinning of the donor substrate 2 is carried out by implantation of ions then fracture of the donor substrate 2, this limit size is substantially 50 µm.

In order to exceed this limit size, the forming of the membrane 20' is carried out on elementary cavities 110. The elementary cavities 110 are then widened, according to at least one direction, even in a plane, parallel to the main plane of extent (x, y) of the surface layer 11 of the supporting substrate 1, to form at least one final cavity 110'. One or more groups of elementary cavities 110 can be defined to correspond to one or more final cavities 110'. As detailed hereinafter, the widening of the elementary cavities 110 can be carried out by etching of the surface layer 11 of the supporting substrate 1. Thus, the pillars 111 between the elementary cavities 110 make it possible to support the donor substrate 2, even the membrane 20' during the forming thereof. The elementary cavities 110 on which the membrane 20' is suspended are then widened, even merged, to form the final cavity 110'. The method thus makes it possible to minimise the risk of damaging the membrane 20' of the device during the manufacture thereof. Furthermore, by widening the elementary cavities 110 after manufacturing the membrane 20', it is possible to obtain a membrane 20' suspended above one or more final cavities 110' that are wider than thanks to the existing solutions.

According to the type of device intended, the geometry of the final cavity 110' can vary. The method makes it possible to start with a supporting substrate 1 that has elementary cavities of given lateral dimensions, regardless of the target geometry of the final cavity 110'. Following the manufacturing of the membrane 20', the elementary cavities 110 can be widened as desired according to the type of target device. The method of manufacturing is thus versatile and simplified in relation to existing solutions.

In addition to the widening of the elementary cavities 110 to form the final cavity or cavities 110', the method further comprises forming at least one anchoring pillar 3 configured to support the membrane 20'. The widening etching of the elementary cavities 110 is furthermore configured so as to selective etch the surface layer 11 with regards to the material of the anchoring pillar 3. For this, the anchoring pillar 3 can be based on, even be made of, a material designated hereinafter as "resistant to etching", i.e. having a resistance to etching greater than the resistance of the surface layer 11 to the etching, during the widening of the elementary cavities 110. More preferably, in the etching conditions of the surface layer 11 of the supporting substrate 1, the etching speed of the anchoring pillar 3 is less than that of the surface layer 11, or even negligible.

Preferably, the at least one anchoring pillar 3 is disposed in such a way as to delimit at least partially the final cavity 110' to be obtained. During the etching of the surface layer 11 aimed at widening the elementary cavities 110, as the anchoring is more resistant to the etching than the surface layer 11, it forms a physical limit to this etching. During this etching, the pillars 111 supporting the membrane can be removed, leading to their qualification as "temporary". The membrane 20' being supported by the anchoring pillar 3, its integrity can be assured despite the removal of the temporary pillars 111.

The anchoring pillar 3 forming a physical limit to this etching, it makes it possible according to the disposition thereof to be able to customise the shape and the dimensions of the final cavity 110' obtained. Furthermore, it makes it possible to increase the reproducibility of the method, by limiting the etching to the shape of the final cavity 110' to be obtained.

The forming of the anchoring pillar 3 is now described in reference to FIGS. 8A to 9B. The forming of the anchoring pillar 3 can include an etching of a portion of the assembly formed by the supporting substrate 1 and the membrane 20', as shown by the arrows in FIGS. 8A to 8C. The etching can be carried out from the rear face 20b' of the membrane to a level of the supporting substrate 1 corresponding to the bottom of the elementary cavities 110. It can be provided that this step of etching be carried out prior to the thinning of the donor substrate 2. Then, this step of etching can be carried out from the rear face of the donor substrate 2, i.e. its face opposite its first face 2a, to a level of the supporting substrate 1 corresponding to the bottom of the elementary cavities 110.

Figure 8A:
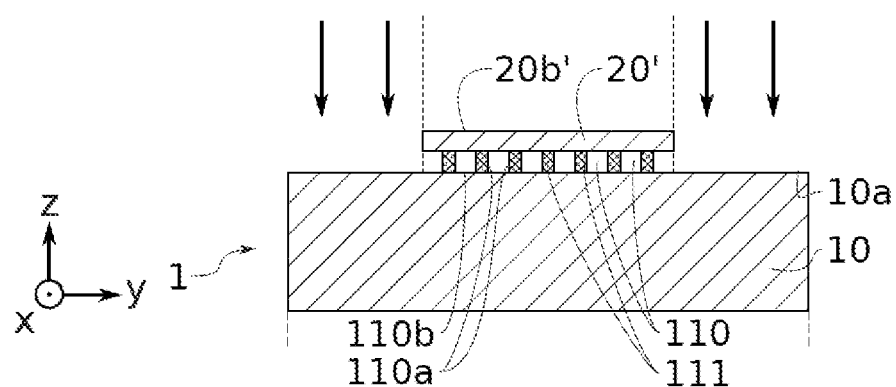
FIGS. 8A to 8C show, following the forming of the membrane, an etching of the donor substrate for different embodiments of the method, according to a transversal cross-section view.
Figure 8B:
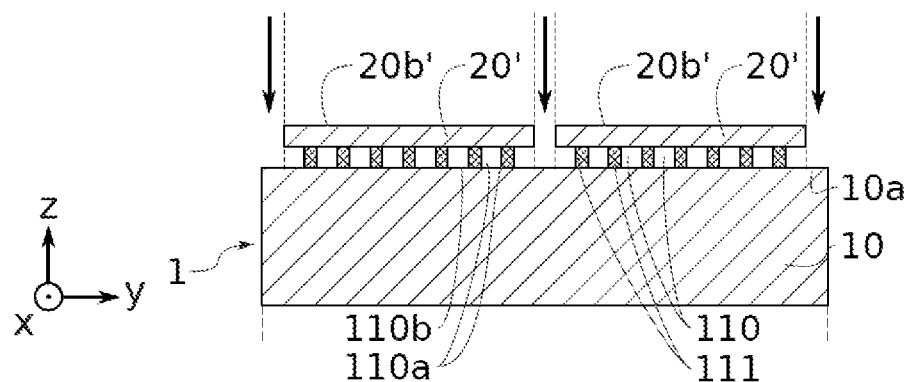
Figure 8C:
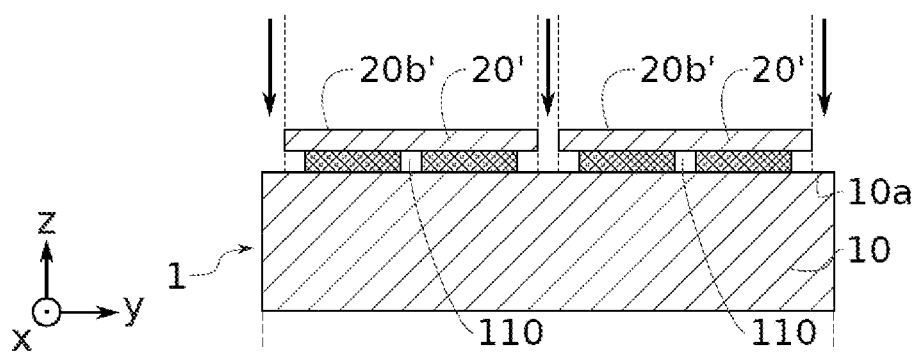

As shown in FIG. 8A, the supporting substrate 1 can be etched until eliminating the surface layer 11. The etched portion can correspond to the location of the anchoring pillar 3 and therefore delimit the final cavity 110' that will be obtained in the plane (x, y). This step of etching can furthermore be used to delimit in the plane (x, y) the membrane 20', and give it the desired shape. A group of elementary cavities 110 defined to correspond to a final cavity 110' can include any cavity located inside the periphery 20d' of the membrane 20'. The unetched portion of the donor substrate 1 and of the membrane 20' can typically extend laterally up to 1 mm, more preferably up to several hundred µm.

Figure 9A:
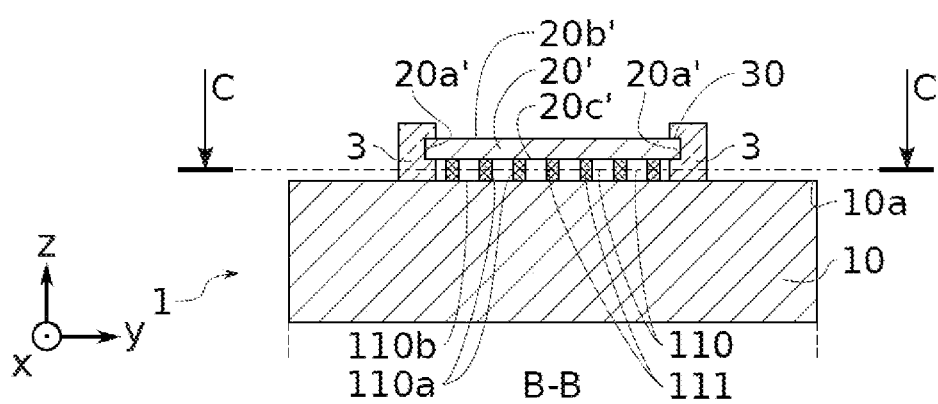
FIGS. 9A and 9B show the forming of an anchoring pillar from the assembling shown in FIG. 8A, for an embodiment of the method, and according to a transversal cross-section view according to the plane B-B shown in FIG. 9C, and a top view.

The anchoring pillar 3 can then be formed by deposition of a material resistant to the etching in the etched portions of the assembly formed by the supporting substrate 1 and the membrane 20'. The anchoring pillar 3 can extend vertically from the surface layer 11 of the supporting substrate 1 to the membrane 20', even beyond the membrane 20'. More preferably, the deposition of this material is configured in such a way that the anchoring pillar 3 follows the vertical contour of the edge 20a' of the membrane 20'. The anchoring pillar 3 obtained supports at least the lower face 20c' of the membrane 20', at least at its edge 20a', as shown in FIG. 9A. Thus the anchoring pillar 3 supports the membrane 20' at least to its edge 20a'. According to an example, the anchoring pillar 3 comprises a profile in the shape of a jaw 30 disposed facing the membrane 20' and configured to surround the membrane 20' via its upper face 20b' and its lower face 20c', at its edge 20a'. The profile in the shape of a jaw 30 can more particularly engage the membrane 20' with the supporting substrate 1 in all of its degrees of freedom.

As shown in FIGS. 8B, 8C and 9D, 9E, the forming of the anchoring pillar 3 can be configured to define adjacent membranes 20' on the donor substrate 1, these membranes 20' able to be supported, at one of their neighbouring ends 20a' between them, by a single anchoring pillar 3.

Figure 9B:
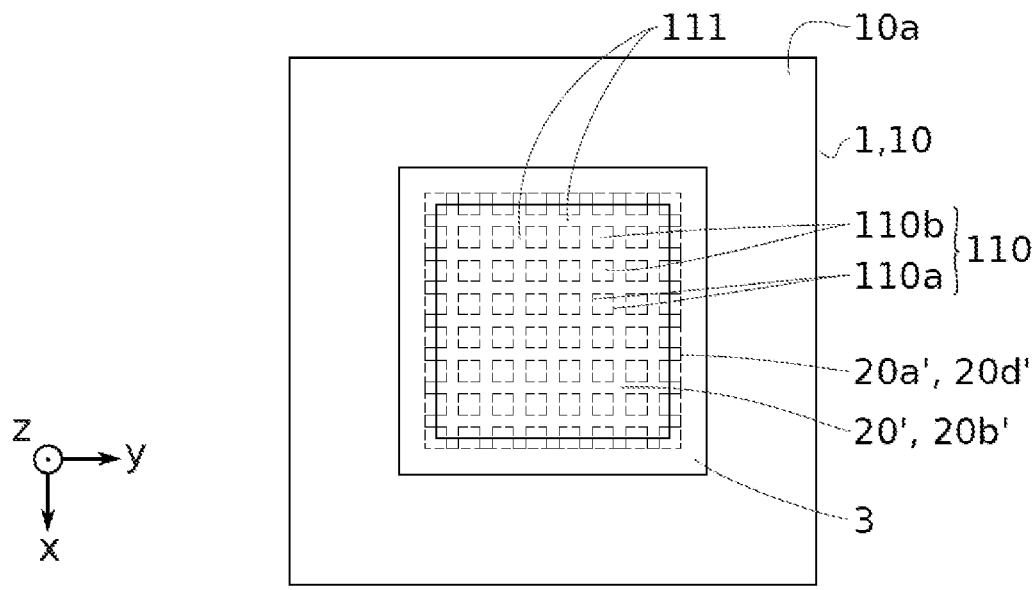

As shown in FIG. 9B, the forming of the anchoring pillar 3 can be configured in such a way that the anchoring pillar 3 is continuous, and extends along at least one edge of the membrane 20'. According to an example, the anchoring pillar 3 is continuous and extends along at least 80%, even 90%, even 99%, even 100% of its periphery 20d' of the membrane 20'. Thus, the anchoring pillar 3 provides good mechanical support to the membrane 20' along its periphery 20d'. The anchoring pillar 3 can form a closed periphery of the membrane 20'.

Figure 9C:
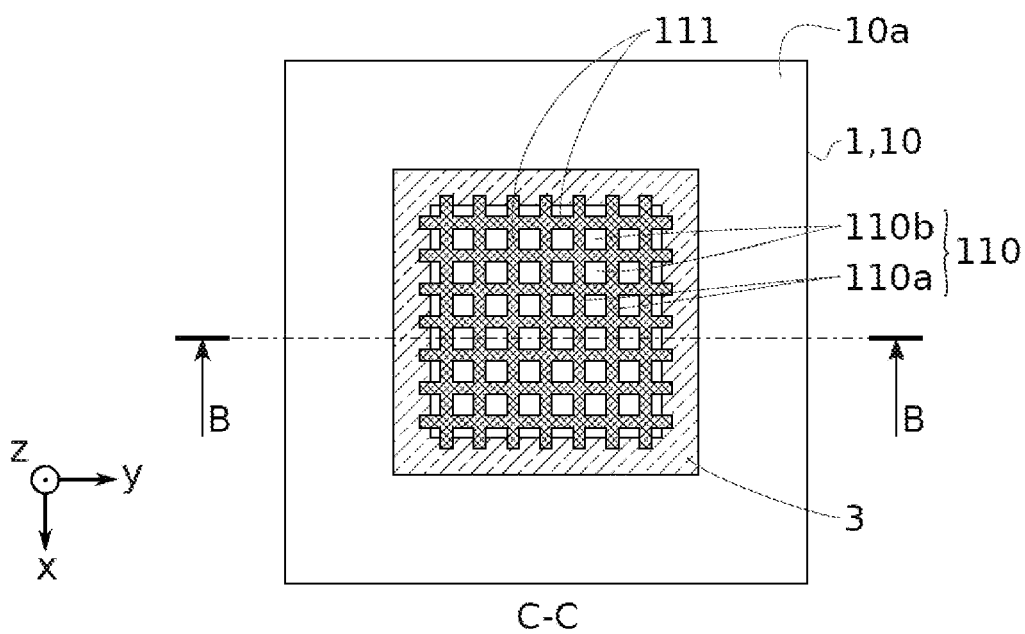
FIG. 9C shows a cross-section view along the plane C-C shown in FIG. 9A.
Figure 9D:
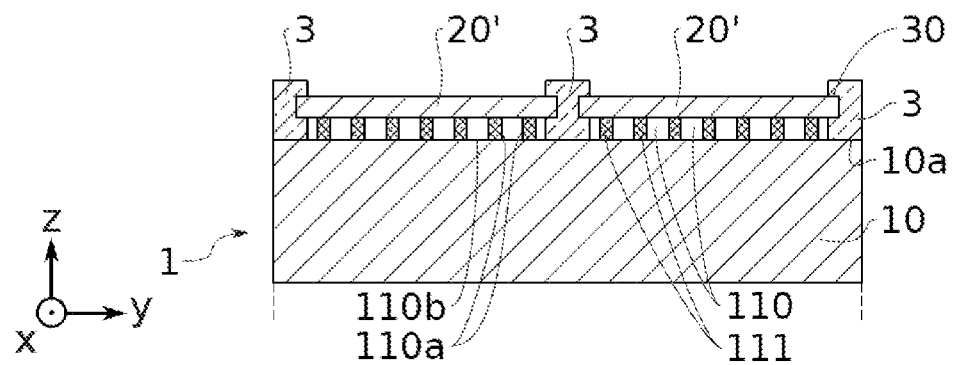
FIGS. 9D and 9E show the forming of an anchoring pillar from the assembling shown respectively in FIGS. 8B and 8C, for an embodiment of the method, and according to a transversal cross-section view.
Figure 9E:
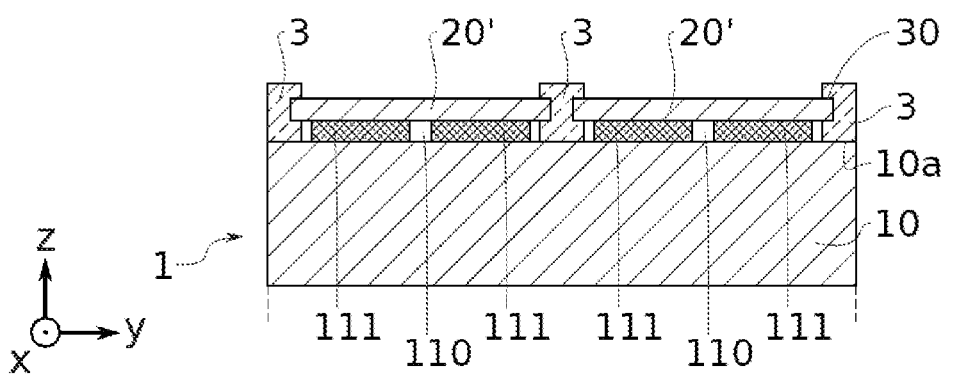

The deposition of the material resistant to the etching can be configured in such a way that the anchoring pillar 3 follows the vertical contour of the membrane 20'. The material can infiltrate at least partially the elementary cavities 110 at the periphery 20d' of the membrane 20', as shown in FIG. 9C.

The anchoring pillar 3 formed can extend laterally over a few μm up to the largest dimension of the target final cavity 110, for example up to a few mm. The material resistant to the etching can be deposited by chemical vapour deposition, and more particularly by atomic layer deposition (ALD). The material resistant to the etching can be a semiconductor or a dielectric. The material resistant to the etching can be monocrystalline silicon, polycrystalline silicon, silicon nitride, alumina and a polymer, such as parylene. In the case where the material resistant to the etching is a polymer, the deposition can be carried out by chemical vapour deposition (abbreviated CVD). The anchoring pillar 3 can be formed from several materials, the anchoring pillar 3 can for example be in the form of a stack of a plurality of layers made of or based on different materials.

In order to carry out the etching of the surface layer 11 of the supporting substrate 1 in such a way as to widen the elementary cavities 110, at least one opening 23 is formed through the membrane 20'. This opening 23 can then be used as an access path to the elementary cavities 110, to inject through this opening 23 an etching compound of the surface layer 11. The opening 23 is described in reference to FIG. 10A. The opening 23 can extend vertically between the upper face 20b' and the lower face 20c' of the membrane 20'. It can be provided that the forming of the opening 23 be carried out prior to the thinning of the donor substrate 2. Then, the forming of the opening 23 can be carried out from the rear face of the donor substrate 2 to its first face 2a.

Figure 10A:
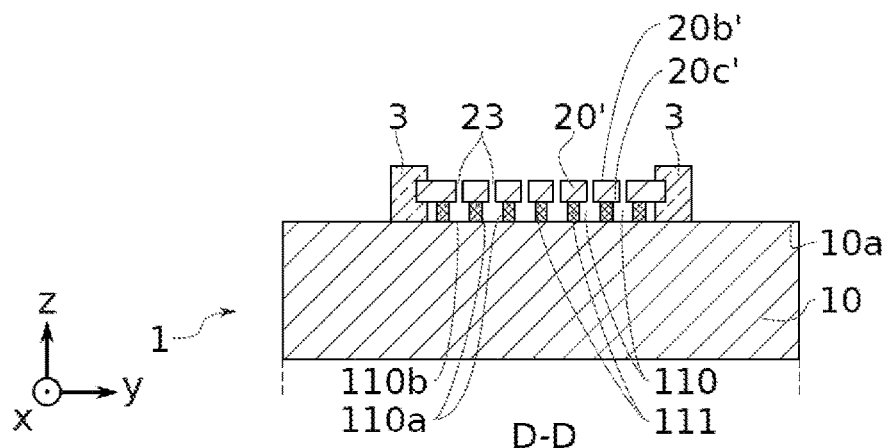
FIGS. 10A and 10B show a forming of an opening in the membrane from the assembling shown in FIG. 9A, for an embodiment of the method and according to a transversal cross-section view according to the plane D-D shown in FIG. 10B, and a top view.
Figure 10B:
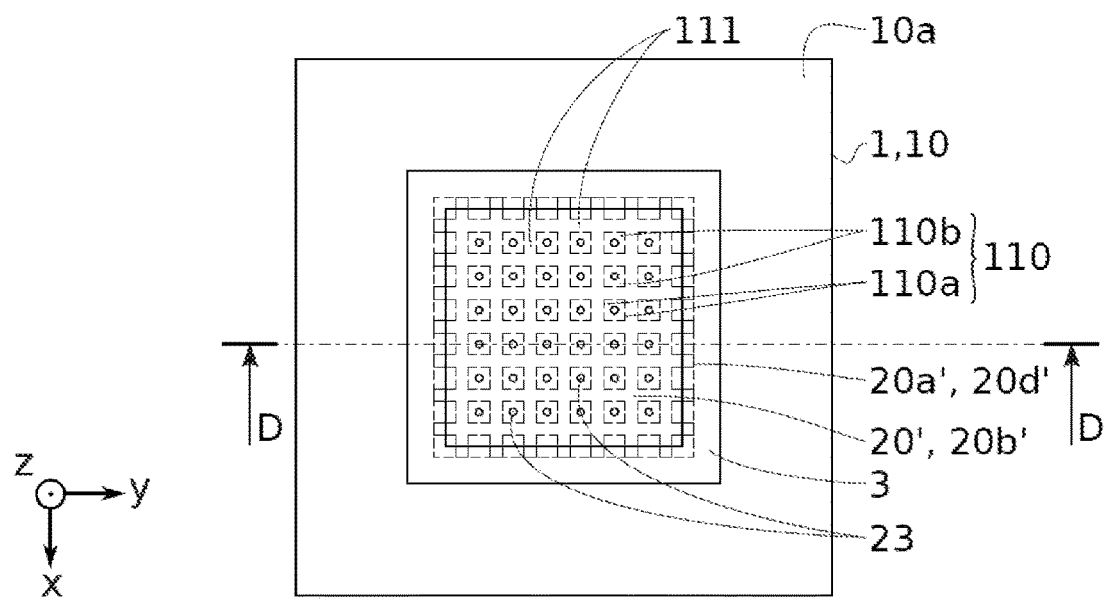

The opening 23 can be formed plumb with an elementary cavity 110. Thus, the etching compound can be injected into an elementary cavity 110 to etch the pillars 111 that surround it. A plurality of openings 23 can be formed in the membrane 20', for example plumb with several elementary cavities 110, even plumb with each elementary cavity 110 as shown in FIG. 10B. Alternatively or as a supplement, an opening or openings 23 can be formed plumb with a pillar 111. In projection in a plane parallel to the main plane of extent (x, y) of the surface layer 11 of the supporting substrate 1, the surface of an opening 23, even of each opening 23, can be contained in the surface of an elementary cavity 110. According to an example, the opening or openings 23 are or circular shape and have a diameter of about a few μm, for example comprised between 1 μm and 10 μm.

An etching compound of the pillars 111 can then be injected through the opening or openings 23 formed to remove the pillars 111. The etching of the surface layer 11 is more preferably a wet etching. A wet etching is advantageously simpler to implement and reduces the cost of the method. This etching compound can be hydrofluoric acid in vapour form or in the liquid state, even hydrofluoric acid in solution. Thus, when the surface layer 11 is based on or made of an oxide, the oxide that constitutes the pillars 111 can be removed. During the injection of the etching compound through the opening 23, the pillars are removed increasingly close from the injection point. According to the etching time and the quantity of etching compound used, a portion of the pillars 111 can be removed over the extent of the final cavity 110' in the plane (x, y). Pillars 111 can thus subsist at the end of the etching, for example at the centre of the membrane in the plane (x, y). The subsisting pillars 111 can delimit several final cavities 110' under the membrane 20'. According to an example all the pillars 111 can be removed over the extent of the final cavity 110' in the plane (x, y), as shown in FIGS. 11A, 11B and 11C.

During the etching of the pillars 111 by injecting an etching compound, preferred paths can appear, for example according to a preferred direction in the plane (x, y). The anchoring pillar 3 being formed from a material resistant to this etching, and more particularly to the etching compound, the etching can be carried out in such a way as to remove the pillars 111 until reaching the anchoring pillar 3. Thus, it is possible to overcome any appearance of preferred etching paths to obtain a final cavity 110' with a defined and reproducible shape. For example, the etching time can be chosen so as to allow for the complete removal of the pillars 111 over the extend of the final cavity 110'.

The openings 23 can then be filled in if necessary, for example to finalise the device 4.

Figure 11A:
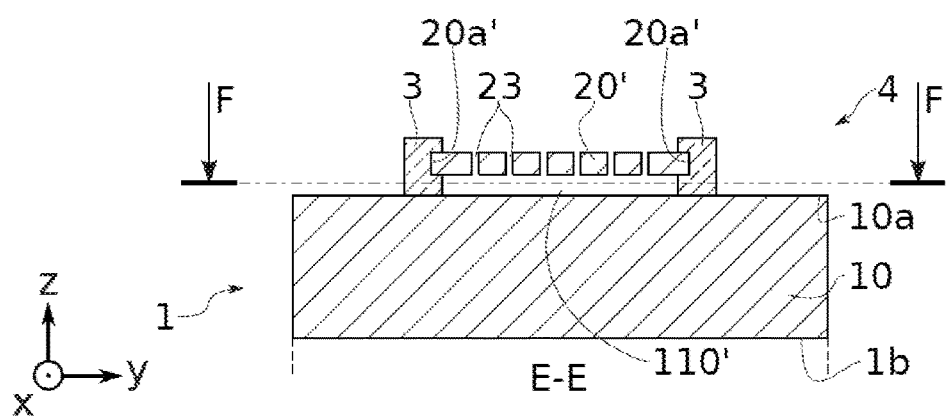
FIGS. 11A and 11B show the device after etching of the surface layer of the supporting substrate, from the assembling shown in FIG. 10A, for an embodiment of the method and according to a transversal cross-section view according to the plane E-E shown in FIG. 11C, and a top view.
Figure 11B:
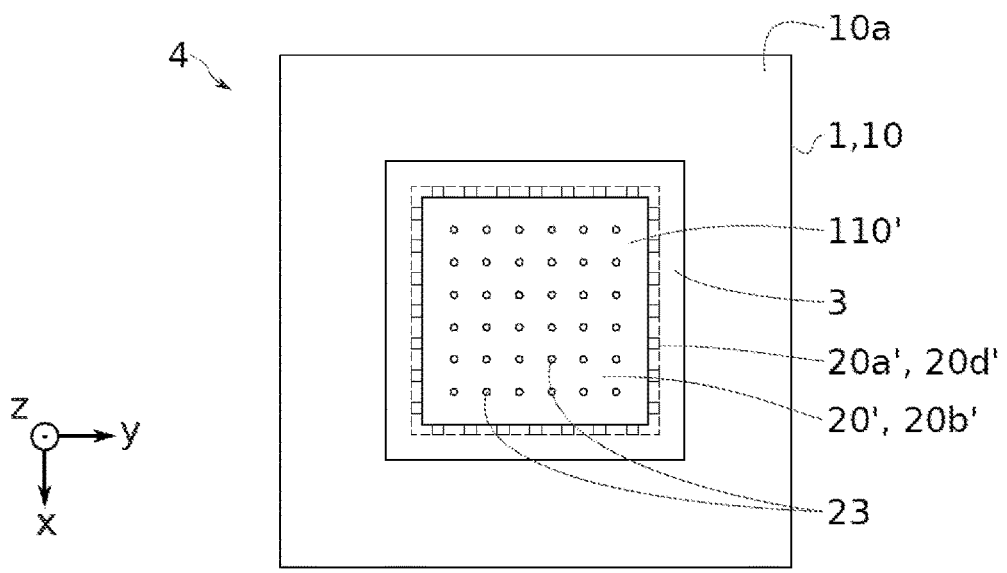
Figure 11C:
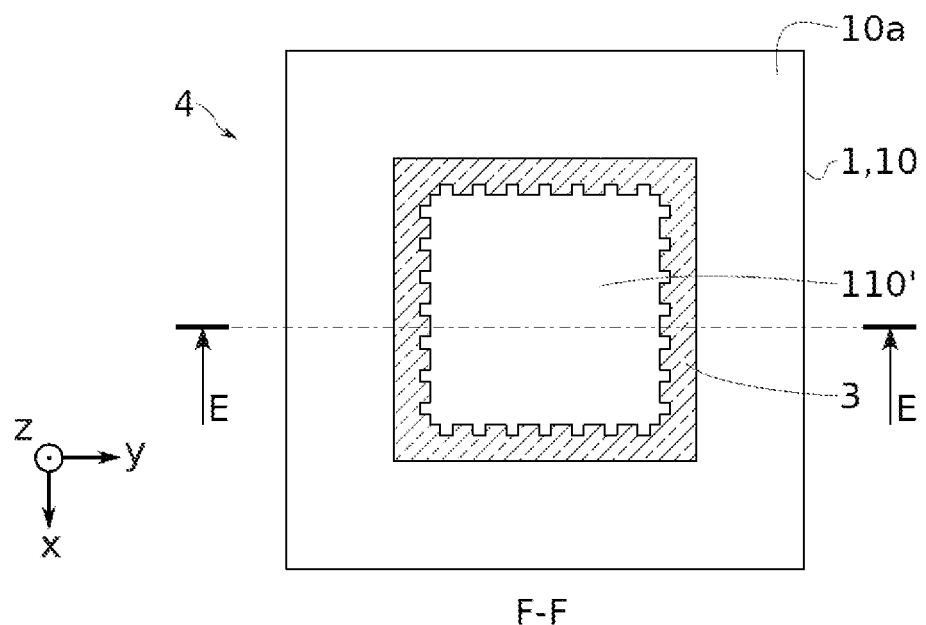
FIG. 11C shows a cross-section view along the plane F-F shown in FIG. 11A.

The method can furthermore comprise a mechanical rectification and/or at least one mechanical-chemical polishing and/or at least one chemical etching at the rear face 1b of the supporting substrate 1, shown for example in FIG. 11A, so as to modulate the thickness of the supporting substrate 1.

Figure 12A:
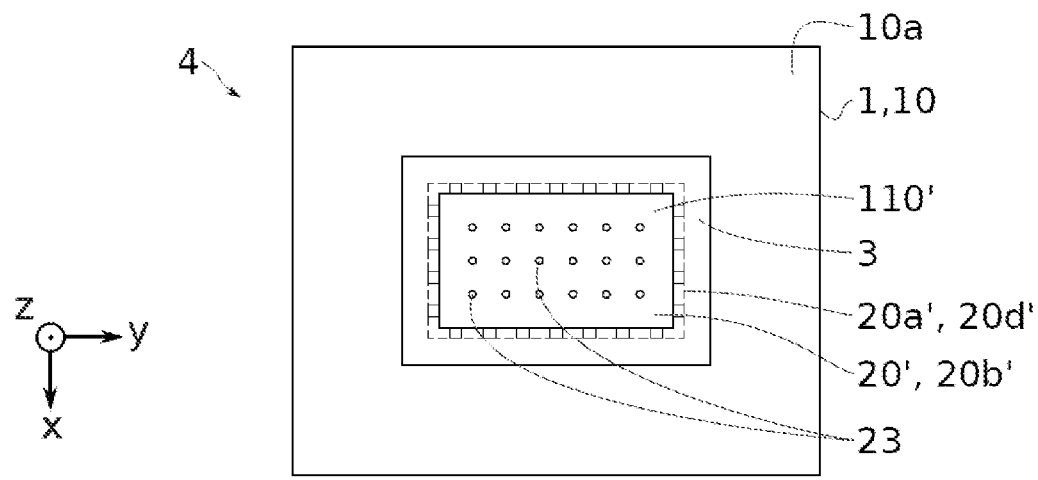
FIG. 12A shows a top view of the device after etching of the surface layer of the supporting substrate, for another embodiment of the method and according to a top view.
Figure 12B:
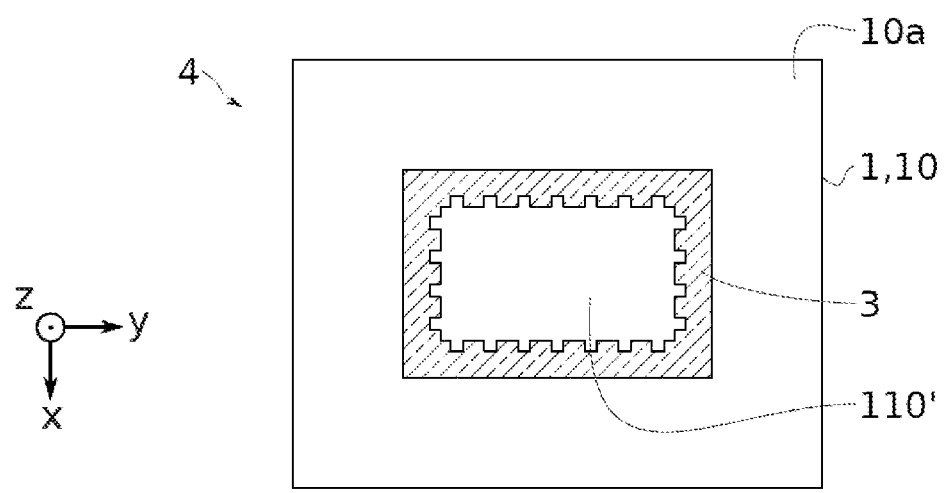
FIG. 12B shows a cross-section view of the device shown in FIG. 12A, along a cutting plane equivalent to the plane F-F shown in FIG. 11A.

A device 4 is thus obtained comprising a membrane 110' suspended above at least one final cavity 110'. It is understood that according to the geometry of the elementary cavities 110, the distribution thereof on the surface of the supporting substrate 1, the dimensions of the membrane 20' and the disposition of the anchoring pillar or pillars 3, a plurality of devices 4 can be obtained. Final cavities 110' of any geometry can be obtained in a reproducible manner. Final cavities 110' that have large dimensions, for example greater than 200×200 μm, can be obtained. It is possible to obtain final cavities 110' with a shape that has dimensions substantially equal to each other in the plane (x, y), for example round, or square as shown in FIGS. 11B and 11C. Alternatively, it is possible to obtain final cavities 110' with a shape that has different dimensions between them in the plane (x, y), for example a rectangle as shown in FIGS. 12A and 12B, or in the shape of an "L".

Alternatives of the method for manufacturing a microelectronic device 4 comprising a membrane 20' suspended above at least one final cavity 110' are now described by way of example.

The method can be configured in such a way that the membrane 20' has any geometrical shape in the plane (x, y). For example, the membrane 20' can be in the shape of a ring, i.e. a disc extending in the plane (x, y) and comprising a central opening. The step of etching of the membrane 20', prior to the deposition of the material or materials of the anchoring pillar 3 can for example be used to give its geometrical shape in the plane (x, y) to the membrane 20'.

The anchoring pillar 3 can be discontinuous, or in an equivalent manner a plurality of punctual anchoring pillars 3 can be formed. The anchoring pillars 3 can be distributed a long at least one edge 20a' of the membrane 20', even along its periphery 20d'. The anchoring pillars 3 can form a discontinuous periphery of the membrane 20d', so as to provide good mechanical support to the membrane 20' along its periphery 20d'.

The formation of the anchoring pillar or pillars 3 can be carried out before assembling the supporting substrate 1 and the donor substrate 2. For example, the anchoring pillars 3 can be formed before or at the same time as the forming of the elementary cavities 110. The anchoring pillar 3 can be deposited in an elementary cavity 110 that is already formed. Following assembling the supporting substrate 1 and the donor substrate 2, and the forming of the membrane 20', at least one anchoring pillar 3 can thus be separated from the periphery 20d' of the membrane 20'. For example, this anchoring pillar 3 can be located at the centre of the membrane 20'. The anchoring pillar 3 can thus delimit at least two final cavities 110' under a membrane 20', or in an equivalent manner delimit two membranes 20', one for each final cavity 110', the two membranes being continuous with one another.

In light of the preceding description, it clearly appears that the invention proposes a method for manufacturing a device comprising a membrane suspended above at least one final cavity, improved in relation to existing solutions. In particular, the method of manufacturing makes it possible to modulate the dimensions of the final cavity while still preserving the integrity of the membrane.

The invention is not limited to the embodiments described hereinabove and extends to all the embodiments covered by the claims.

LIST OF NUMERICAL REFERENCES

1 Supporting substrate
1*a* First face
10 Upper portion
10*a* Interface with the surface layer
11 Surface layer
110 Elementary cavity
110' Final cavity
110*a* Lateral wall
110*b* Bottom
111 Pillar
2 Donor substrate
2*a* First face
20 Surface layer
20' Membrane
20*a*' Edge
20*b*' Upper face
20*c*' Lower face
20*d*' Periphery
21 Oxidised portion
2*b* Rear face
22 Buried portion
22' Fracture zone
23 Opening
3 Anchoring pillar
30 Profile in the shape of a jaw

The invention claimed is:

1. A method for manufacturing a microelectronic device comprising a membrane suspended above at least one final cavity, the method comprising:
   forming at least one elementary cavity in a surface layer of a supporting substrate, the supporting substrate comprising the surface layer having a first surface face, the at least one elementary cavity opening at the first surface face; then
   forming at least one of the membrane suspended above the at least one final cavity, the forming of the membrane comprising:
      assembling the supporting substrate and a donor substrate having a first donor face, by attaching the first surface face to the first donor face, such that the donor substrate covers at least partially the at least one elementary cavity; then
      thinning the donor substrate so as to form the membrane;
   before or after the forming of the membrane, forming at least one anchoring pillar of the membrane, the at least one anchoring pillar being:
      based on at least one material different from a material forming the surface layer; and
      configured to support at least one lower membrane face of the membrane, at least at an edge of the membrane; and
      after the forming of the at least one anchoring pillar, and
   after the assembling, etching the surface layer of the supporting substrate so as to widen the at least one elementary cavity, in at least one direction parallel to a main x, y-plane of extension of the first surface face of the supporting substrate, to form the final cavity,
   wherein the etching selectively etches the surface layer with respect to the at least one material of the at least one anchoring pillar.

2. The method of claim 1, wherein the forming of the at least one anchoring pillar is configured so that the at least one anchoring pillar is continuous, and extends along at least one edge of the membrane.

3. The method of claim 1, wherein the forming of the at least one anchoring pillar is configured so that the at least one anchoring pillar is punctual, a plurality of anchoring pillars being distributed along at least one edge of the membrane.

4. The method of claim 1, wherein the forming of the at least one anchoring pillar is configured so that the at least one anchoring pillar is configured to surround at least the lower membrane face and an upper membrane face of the membrane.

5. The method of claim 1, wherein, the at least one elementary cavity being defined by cavity lateral walls and a cavity bottom, the forming of the at least one anchoring pillar is carried out after the assembling of the supporting and donor substrate, the forming comprising:
   etching at least one portion of the assembly formed by the donor substrate and the supporting substrate, from a second donor face of the donor substrate or an upper membrane face of the membrane, to a depth of the supporting substrate equal to a depth of the cavity bottom; and
   depositing the at least one material of the at least one anchoring pillar.

6. The method of claim 5, wherein the deposition of the at least one material of the at least one anchoring pillar is an atomic layer deposition.

7. The method of claim 1, wherein the etching of the surface layer of the supporting substrate comprises:
   forming at least one opening through the donor substrate or the membrane; and
   injecting through the at least one opening an etching compound.

8. The method of claim 1, wherein the forming of the at least one elementary cavity in the surface layer of the supporting substrate, comprises forming several elementary cavities, the elementary cavities forming an array, preferably periodic, in the main x, y-plane of extension of the first surface face of the surface layer of the supporting substrate.

9. The method of claim 1, wherein
   the forming of the at least one elementary cavity in the surface layer of the supporting substrate, comprises forming several elementary cavities,
   wherein the method further comprises, prior to the etching of the surface layer of the supporting substrate, defining a group of elementary cavities, and
   wherein the etching of the surface layer of the supporting substrate merges together the elementary cavities of the group, to form the final cavity.

10. The method of claim 1, wherein the thinning of the donor substrate comprises oxidizing the donor substrate, to form an oxidized portion extending to a first donor portion of the donor substrate configured for forming the membrane, then etching the oxidized portion of the donor substrate.

11. The method of claim 1, further comprising:

implanting the donor substrate with one or more ions in a buried portion of the donor substrate, the buried portion being disposed at the interface between a first donor portion of the donor substrate configured for forming the membrane and a second donor portion of the donor substrate configured for forming the rest of the donor substrate wherein the thinning of the donor substrate comprises fracturing the donor substrate at the buried portion.

12. The method of claim 1, wherein the assembling the supporting substrate and the donor substrate comprises direct bonding the first donor face to the first substrate face.

13. The method of claim 1, wherein the thinning of the donor substrate provides a membrane with a thickness in a range of from 0.05 µm to 20 µm.

14. The method of claim 1, wherein the at least one anchoring pillar comprises monocrystalline silicon, polycrystalline silicon, silicon nitride, alumina, a polymer, or a mixture of two or more of any of these.

15. The method of claim 1, wherein an upper portion of the supporting substrate and/or a surface layer of the donor substrate comprises silicon, a silicon semiconductor alloy a silicon-germanium alloy, or a mixture of two or more of any of these.

16. The method of claim 8, wherein the array is periodic.

17. The method of claim 1, wherein an upper portion of the supporting substrate and/or a surface layer of the donor substrate comprises silicon carbide.

18. The method of claim 1, wherein an upper portion of the supporting substrate and/or a surface layer of the donor substrate comprises a silicon-germanium alloy.

* * * * *